US010542618B1

(12) United States Patent
Zhang et al.

(10) Patent No.: US 10,542,618 B1
(45) Date of Patent: Jan. 21, 2020

(54) PRINTED CIRCUIT BOARD WITH ROUTING OF A CONDUCTOR AND DIELECTRIC STRANDS

(71) Applicant: International Business Machines Corporation, Armonk, NY (US)

(72) Inventors: Yanyan Zhang, Austin, TX (US); Lloyd Andre Walls, Austin, TX (US); Jinwoo Choi, Austin, TX (US); Mehdi Mohamed Mechaik, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/130,933

(22) Filed: Sep. 13, 2018

(51) Int. Cl.
*H05K 1/02* (2006.01)
*H05K 1/03* (2006.01)
*H01B 3/08* (2006.01)

(52) U.S. Cl.
CPC .............. *H05K 1/024* (2013.01); *H01B 3/08* (2013.01); *H05K 1/025* (2013.01); *H05K 1/0242* (2013.01); *H05K 1/036* (2013.01)

(58) Field of Classification Search
CPC ...... H05K 1/024; H05K 1/0242; H05K 1/025; H05K 1/036; H05K 1/0218; H01B 3/08; H01P 3/08
USPC .................................. 174/251, 255; 361/777
See application file for complete search history.

(56) References Cited

U.S. PATENT DOCUMENTS

| 3,371,250 | A | * | 2/1968 | Ross | H05K 1/038 |
|---|---|---|---|---|---|
| | | | | | 139/425 R |
| 6,180,215 | B1 | * | 1/2001 | Sprietsma | B32B 27/04 |
| | | | | | 428/209 |
| 6,783,841 | B2 | | 8/2004 | McCarthy | |
| 8,237,058 | B2 | | 8/2012 | Freda | |
| 8,242,380 | B2 | | 8/2012 | Bois | |
| 9,307,636 | B2 | | 4/2016 | Kato | |
| 9,596,749 | B2 | | 3/2017 | Chen | |
| 2003/0203174 | A1 | | 10/2003 | McCarthy | |
| 2005/0146403 | A1 | * | 7/2005 | Okubora | H01L 23/66 |
| | | | | | 333/247 |
| 2008/0176471 | A1 | * | 7/2008 | Ogihara | D03D 9/00 |
| | | | | | 442/203 |
| 2008/0196933 | A1 | | 8/2008 | Bois | |
| 2011/0272186 | A1 | | 11/2011 | Freda | |

(Continued)

OTHER PUBLICATIONS

Singh, Surender, High Speed PCB Designing for EMC in Biomedial Systems, Thesis Submitted for the award of Doctor of Philosophy, Electrical and Instrumentation Engineering Department, Jul. 2015.

(Continued)

*Primary Examiner* — Steven T Sawyer
(74) *Attorney, Agent, or Firm* — Lieberman & Brandsdorfer, LLC

(57) ABSTRACT

Embodiments are directed to a printed circuit board and a method of manufacturing the printed circuit board. The PCB is a multi-layer component, including a dielectric material, an intermediate layer positioned adjacent to the dielectric material, and a conductor positioned adjacent to the intermediate layer. The intermediate layer is comprised of fiberglass strands having an associated orientation. When assembled, the fiberglass of the intermediate layer and the conductor having a matching orientation and separation distance from a source to a destination.

7 Claims, 7 Drawing Sheets

(56) References Cited

U.S. PATENT DOCUMENTS

| | | | |
|---|---|---|---|
| 2011/0308840 A1* | 12/2011 | Ooi | H05K 1/0248 |
| | | | 174/251 |
| 2014/0158406 A1* | 6/2014 | Kato | H05K 1/024 |
| | | | 174/250 |
| 2014/0292450 A1* | 10/2014 | Kato | H01P 3/003 |
| | | | 333/238 |
| 2016/0174361 A1 | 6/2016 | Chen | |
| 2017/0098880 A1 | 4/2017 | Hidaka | |

OTHER PUBLICATIONS

G. Romo, C. Nwachukwu, R. Torres-Torres, S. Baek, and M. Schauer, "Stack-up and rounting optimization by understanding micro-scale PCB effects," DesignCon 2011.

Hall, Stephen H., Advanced Signal Integrity for High-Speed Digital Designs, Wiley, 2009, pp. 274-279.

McMorrow, Scott, et al., Anisotropic Design Considerations for 28 Gbps Via to Stripline Transitions, DesignCon 2015.

Miller, Jason R., et al., "Additional Trace Losses Due to Glass-Weave Periodic Loading," DesignCon 2010.

P. Pathmanathan, C. M. Jones, S. G. Pytel, D. L. Edgar, and P. G. Huray, "Power loss due to periodic structures in high-speed packages and printed circuit boards", Microelectronics and Packaging Conference, 18th European, 2011.

S. McMorrow, C. Heard, "The impact of PCB laminate weave on the electrical performance of differential signaling at multi-gigabit data rates", DesignCon 2005.

\* cited by examiner

PRINTED CIRCUIT BOARD WITH ROUTING OF A CONDUCTOR AND DIELECTRIC STRANDS

BACKGROUND

The present disclosure relates generally to a printed circuit board. More specifically, the embodiments of the disclosure relate to a printed circuit board configured to mitigate resonance associated with transmission across an associated conductor.

Advances in fabrication technologies continue to increase performance and throughput of circuit devices. Enabling the circuit devices to maintain high throughput generally requires high data rates. PCBs are commonly configured with two or more layers in which signal traces are routed. Typical printed circuit board (PCB) laminates are comprised of layers of woven fiberglass cloth impregnated and bound together in epoxy resin. Both the fiberglass and the resin may be composite materials with different electrical properties, such as dielectric constant and loss tangent. It is understood that the associated weave is comprised of peaks and valleys, which create a non-homogeneous cross section in the dielectric(s). Local micro-scale fiber weave effects work as interconnects with periodic loading, which leads to a fundamental resonance on a high speed signal. Inherent characteristics of the weave results in fundamental resonance at high frequency, which significantly attenuates digital signal bandwidth and degrades the signal integrity, including insertion loss and return loss.

SUMMARY

The disclosed embodiments pertain to an apparatus and method directed at a printed circuit board and a method of producing the printed circuit board.

In one aspect, a printed circuit board (PCB) is provided. The PCB is comprised of first and second dielectric materials, each in communication with an associated ground conductive layer, forming first and second layers of the PCB, and an intermediate layer positioned between the first and second dielectric materials. The intermediate layer is comprised of first and second fiberglass materials and a conductor to carry a signal trace. More specifically, the first fiberglass material is positioned between the conductor and the first dielectric material, and the second fiberglass material is positioned between the conductor and the second dielectric material.

In another aspect, a method for producing a printed circuit board is provided. A first fiberglass weave is formed by interweaving a first set of fiberglass bundles in a first orientation and a second set of fiberglass bundles in a second orientation. A ground conductive layer is positioned in communication with the first fiberglass weave. An intermediate layer having a conductor and first and second nonwoven fiberglass strands is formed. The first and second fiberglass strands are positioned between a first side of the conductor and the first fiberglass weave. Following the positioning of the layers and their associated components, an epoxy resin is deposited to bind the intermediate layer with the first fiberglass weave, and thereafter is subject to a curing process to form the printed circuit board.

In yet another aspect, a printed circuit board (PCB) is provided with a micro-strip type transmission line. The PCB is comprised of a first dielectric material in communication with an associated ground conductive layer, forming a first layer of the PCB, and an intermediate layer positioned adjacent to the first dielectric material. The intermediate layer is comprised of first fiberglass materials and a conductor to carry a signal trace. More specifically, the first fiberglass material is positioned between the conductor and the first dielectric material.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments, and not of all embodiments, unless otherwise explicitly indicated.

DETAILED DESCRIPTION

It will be readily understood that the components of the present embodiments, as generally described and illustrated in the Figures herein, may be arranged and designed in a wide variety of different configurations. Thus, the following detailed description of the embodiments of the apparatus, system, and method of the present embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment of the present embodiments. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Printed circuit board (PCB) laminates are comprised of woven fiberglass fabric with an epoxy resin. Mechanical and electrical properties of the PCB depend on the density of the weave, the materials, thread counts, etc. The peaks and valleys that are inherent characteristics of the woven fiberglass fabric cause resonant power loss of an associated transmission signal. The non-uniform distance between the transmission signal and the fiberglass fabric across the PCB affects the signal and associated signal resonance and loss. Accordingly, the conventional PCB laminate with the woven fiberglass fabric creates fundamental resonance caused by periodic loading of the laminate structure.

Figure 1:
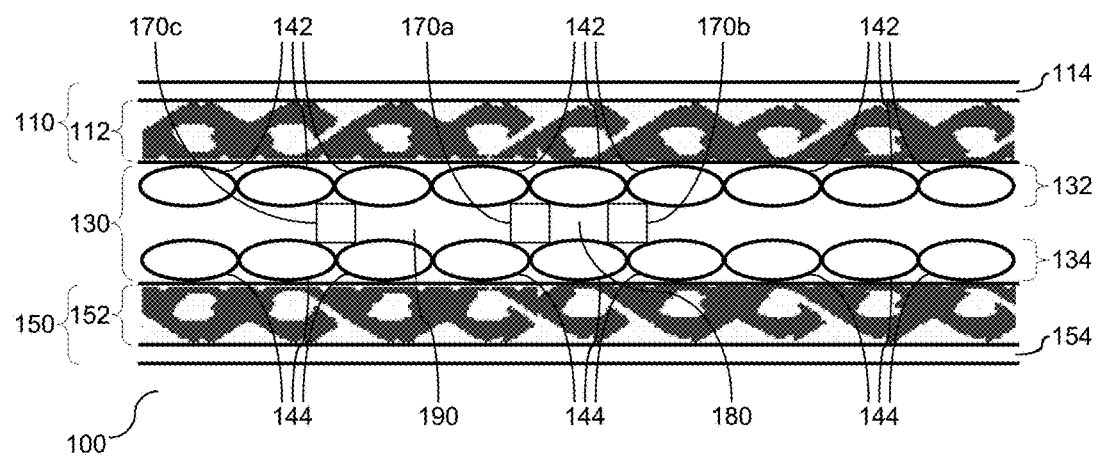
FIG. 1 depicts a diagram illustrating a cross section of the PCB laminate.

As shown and described, the structure of the PCB laminates is a modification to strengthen the mechanical and electrical properties of a composite PCB substrate. Referring to FIG. 1, a diagram (100) is provided illustrating a cross section of the PCB laminate. As shown, two fiberglass weaves are present with the substrate, shown herein as woven fabric$_0$ (112) and woven fabric$_1$ (152). Each of the fabrics is in contact or communication with a ground conductive layer. As shown herein, woven fabric$_0$ (112) is in contact with ground conductive layer, ground$_0$, (114), and woven fabric$_1$ (152) is in contact with ground conductive layer, ground$_1$, (154). Fabric$_0$ (112) and ground$_0$ (114) form a first layer of the substrate, layer$_0$ (110). Similarly, fabric$_1$ (152) and ground$_1$ (154) form a third layer of the substrate, layer$_2$ (150).

The substrate is comprised of three layers, with an intermediate layer (130), e.g. layer$_1$, positioned between layer$_0$ (110) and layer$_2$ (150). fabric$_0$ (110). The intermediate layer (130) is shown with a conductor, a differential pair, or a combination of conductor and differential pairs. In this example, the intermediate layer (130) is shown with conductors (170a) and (170b) that form a differential pair. Although two conductors are shown herein, this embodiment should not be considered limiting. In one embodiment, the conductors (170a) and (170b) may be replaced with a single conductor, referred to herein as a single ended conductor. As shown, the conductors (170a) and (170b) are positioned between the first and third layers, (110) and (150), respectively. The intermediate layer, layer$_1$ (130), is shown with non-woven fiberglass, e.g. strands, positioned within the substrate. More specifically, two bundles of the strands are shown in layer$_1$ (130), including bundle$_0$ (132) and bundle$_1$ (134). In one embodiment, the bundle may form a row or layer of strands. Bundle$_0$, (132), is shown herein with multiple strands of non-woven fiberglass, shown herein as strands (142) positioned across the first bundle (132). The strands (142) are positioned proximal to fabric$_0$ (112). Similarly, bundle$_1$ (134), also referred to herein as a second bundle, is shown herein with multiple strands of non-woven fiberglass, shown herein as strands (144) positioned across the second bundle (134). The strands (144) are positioned proximal to fabric$_1$ (152).

Resin is used to bind all the layers of the substrate, including the first layer (110), the intermediate layer (130), and the third layer (150). The conductor pair, (170a) and (170b), is shown positioned within the intermediate layer (130) and proximal to the strands. As shown herein, the conductors (170a) and (170b) that form the conductor pair are positioned adjacent to and relatively parallel with the strands (142) and (144). A gap (180) is shown between the conductors (170a) and (170b). As further shown, a third conductor (170c), referred to as a single ended conductor, is positioned in the intermediate layer (130) and spaced apart from the differential pair (170a) and (170b) via gap (190). In the example shown herein, both a single ended conductor and a differential pair are shown within the intermediate layer. In one embodiment, additional conductors and may be positioned in the intermediate layer, and the quantity shown herein should not be considered limiting. Accordingly, the substrate may be configured with a single ended conductor and/or a differential pair, or in one embodiment, a plurality of single ended conductors and differential pairs.

The strands are shown positioned within the intermediate layer (130) at discrete locations and relative to conductors, shown herein as the conductor pair, (170a) and (170b), and single ended conductor (170c). As shown, first bundle (132) is parallel or relatively parallel to the second bundle (134), with the first bundle (132) positioned above the conductors (170a), (170b), and (170c) and the second bundle (134) positioned below the conductors (170a), (170b), and (170c). More specifically, one side of the conductors is positioned in communication with the first bundle (132) and an oppositely disposed side of the conductors is in communication with the second bundle (134). As shown herein, and further described in FIG. 2 below, the conductor(s) run parallel to the strands (132) and (134) and follows the routing needed to connect a driver and a receiver for various components. In the example shown herein, the coupled conductor pair (170a) and (170b) are positioned parallel to strands (132) and (134), and the single ended conductor (170c) is positioned parallel to the strands (132) and (134) and spaced apart from the coupled conductor pair (170a) and (170b).

Figure 2:
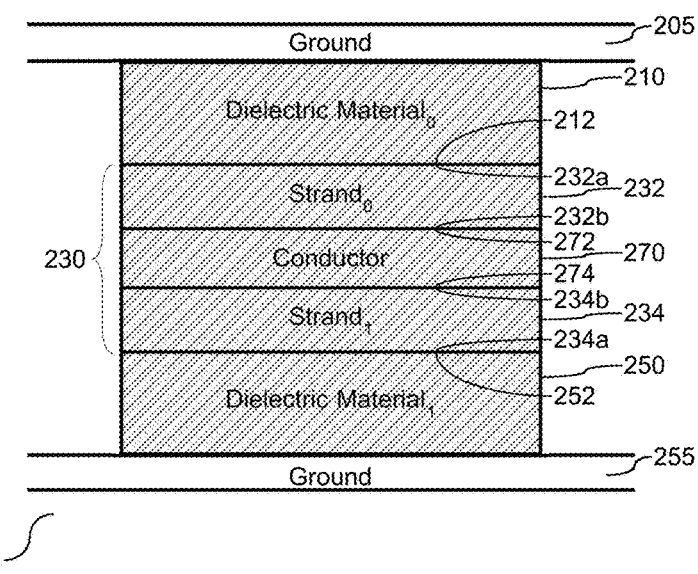
FIG. 2 depicts a block diagram illustrating a cross section of the PCB and positioning of the intermediate layer with respect to the fiberglass weaves.

Referring to FIG. 2, a block diagram (200) is provided illustrating a cross section of the PCB and positioning of the intermediate layer with respect to the fiberglass weaves. As shown and described above, the substrate is formed with exterior layers (205) and (255), respectively, comprised of ground conductive material, e.g. a ground conductive layer. In one embodiment, these layers are comprised of copper material. The fiberglass weaves are comprised of dielectric material and are in contact with the ground material that form the exterior layers of the PCB with an intermediate layer positioned between the layers of fiberglass weaves. The first layer is referred to herein as dielectric material$_0$ (210) and the third layer is referred to herein as dielectric material$_1$ (250). The first and third layers (210) and (250), respectively, are placed on both sides of the intermediate layer (230). As shown and described above, the intermediate layer (230) is comprised of three components, including fiberglass strands and at least one conductor a coupled conductor pair, or a combination of conductors and conductor pairs, referred to herein collectively as a conductor. As shown in detail in FIG. 1, the layer that forms the fiberglass strands is comprised of individual fiberglass strands that are bound within the substrate by an epoxy resin. The first layer of fiberglass strands (232) is referred to herein as strand$_0$, and the second layer of fiberglass strands (234) is referred to as strand$_1$. Each of the strand layers (232) and (234) are comprised of multiple strands being relatively aligned and co-planar.

As shown, strand$_0$ (232) has a first side (232a) positioned proximal to a first side (212) of the first layer, layer$_0$ (210). Strand$_0$ (232) has a second side (232b) positioned proximal to a first side (272) of the conductor (270). Similarly, strand$_1$ (234) has a first side (234a) positioned proximal to a first side (252) of the third layer, layer$_2$ (250), and a second side (234b) positioned proximal to a second side (274) of the conductor (270). Accordingly, the layers (210), (230), and (250) are stacked an in contact with each other at their respective surfaces, without any spacing, or in one embodiment minimal spacing, between the layers. The first and third layers (210) and (250), each comprised of dielectric material, provide strength to the PCB, and the strands (232) and (234) mitigate resonant power loss associated with the signal transmitted through the conductor (270).

Figure 3:
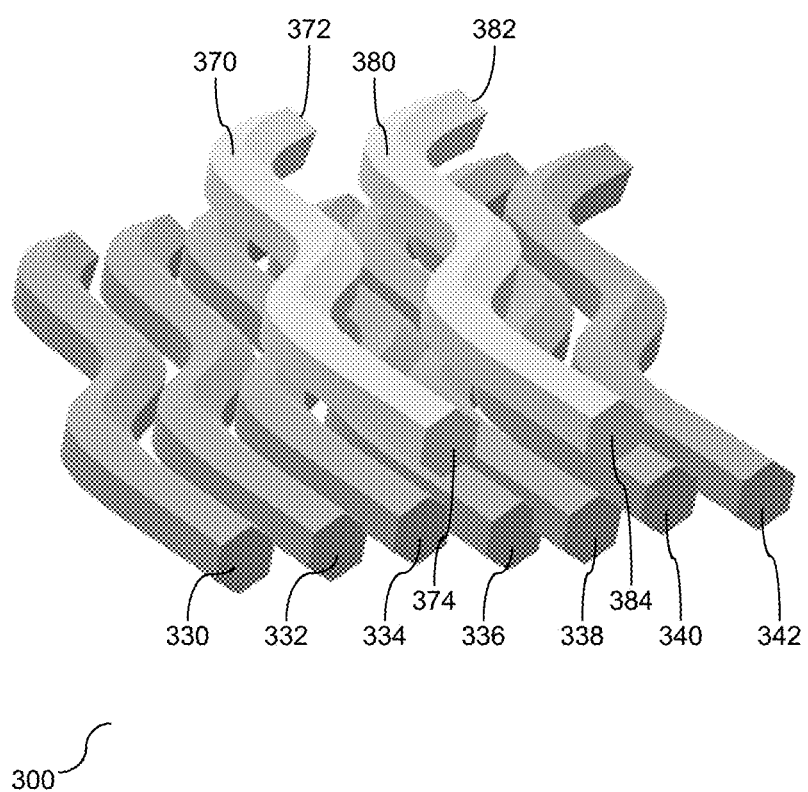
FIG. 3 depicts a diagram illustrating an enlarged perspective view of the PCB laminate with a focus on the conductor (s) and fiberglass strands.

Referring to FIG. 3, a diagram (300) is provided illustrating an enlarged perspective view (300) of the PCB laminate with a focus on the conductor(s) and fiberglass strands. Two conductors are shown herein as (370) and (380). The conductors may form a coupled conductor pair, or in one embodiment may be separate single ended conductors. The conductors and their associated signal route may be a straight path or a non-straight path. As shown in the example, the conductor routes are not straight, e.g. non-linear, although the routes shown herein are merely an example and should not be considered limiting. The conductors (370) and (380) are positioned co-planar and spaced apart. Non-woven fiberglass strands (330)-(342) are shown positioned adjacent to the conductors (370) and (380), and more specifically below the conductors (370) and (380), e.g. adjacent to one side of the conductors. The fiberglass strands (330)-(342) are adjacently positioned to mitigate, or in one embodiment eliminate, gaps formed between proximally positioned strands. Similarly, the conductors (370) and (380) are adjacent to and in communication with one or more of the strands (330)-(342), with spacing there between mitigated or in one embodiment eliminated. In addition and as further shown, the non-woven fiberglass strands (330)-(342) conform to the path of the conductors (370) and (380) such that the strands and the conductors (370) and (380) are parallel from the source (372) to the destination (374) and source (382) to destination (384), respectively.

As shown and described in FIGS. 1-3, woven fiberglass layers are utilized within the PCB to strengthen the mechanical properties of the composite PCB. The woven fiberglass layers, e.g. dielectric material, are placed or positioned on both sides of the non-woven strands and furthest away from the associated signal route. The non-woven fiberglass layers, also referred to herein as strands, are position adjacent to the woven layers and parallel with the signal route. The placement and position of the non-woven fiberglass layers remove fundamental resonance caused by periodic loading of the woven fiberglass layers. Accordingly, fundamental power resonance is effectively removed by modifying the internal laminate structure of the PCB.

Figure 4:
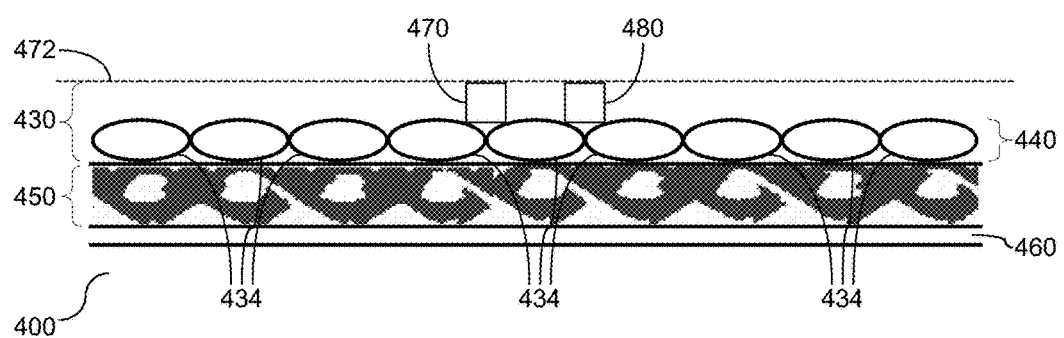
FIG. 4 depicts a diagram illustrating a cross section of the PCB laminate with a micro-strip type transmission line showing a conductor pair.

The embodiments shown and described in FIGS. 1-3 may also be applied to a micro-strip type transmission line. Referring to FIG. 4, a diagram (400) is provided illustrating a cross section of the PCB laminate with a micro-strip type transmission line with a conductor pair. It is understood in the art that a micro-strip is a type of electrical transmission line which can be fabricated using printed circuit board technology. More specifically, as shown and described herein the conductor is in the form of a conductor pair, (470) and (480), printed on an external layer (472) of the board. A fiberglass weave is shown herein as woven fabric (450) positioned adjacent to an external grounded conductive layer (460). An intermediate layer (430) is positioned adjacent to the woven fabric (450). The intermediate layer (430) is a layer with a conductor and non-woven fiberglass, e.g. strands (434). A single bundle (440) of the strands (434) is provided and positioned in the intermediate layer (430). The strands (434) are positioned proximal to the woven fabric (450) and proximal to the conductor (470). As shown, the bundle of strands (434) is positioned in contact with the conductor pair (470) and (480) and also positioned in contact with the woven fabric (450). The strands (434) are adjacently positioned with minimal or no openings formed there between. As shown, the strands (434) run parallel to the conductor pair (470) and (480) and follow the routing needed to connect a driver and a receiver for various components. Accordingly, the conductor pair (470) and (480) are spaced apart from the dielectric material (450) via the bundle of strands (434), with the conductor pair and the strands (434) having a matching orientation and path from a source to a destination.

Figure 5:
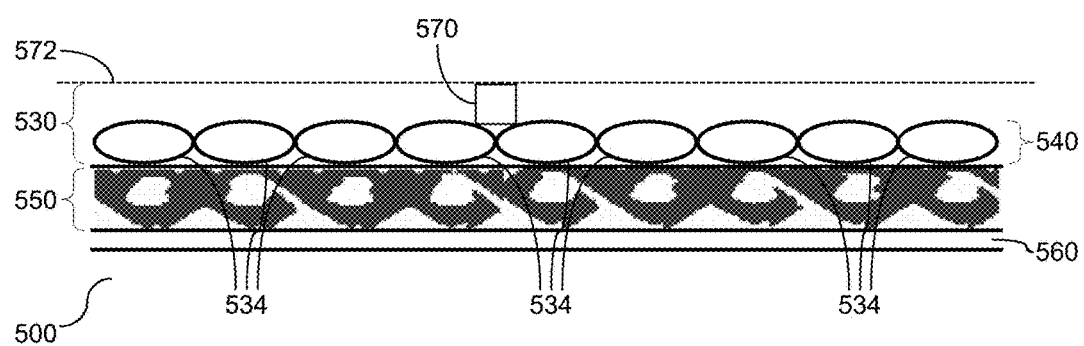
FIG. 5 depicts a diagram illustrating a cross section of the PCB laminate with a micro-strip type transmission line showing a single ended conductor.

Referring to FIG. 5, a diagram (500) is provided illustrating a cross section of the PCB laminate with a micro-strip type transmission line with a single ended conductor. It is understood in the art that a micro-strip is a type of electrical transmission line which can be fabricated using printed circuit board technology. More specifically, as shown and described herein the conductor is in the form of a single ended conductor (570) printed on an external layer (572) of the board. A fiberglass weave is shown herein as woven fabric (550) positioned adjacent to an external grounded conductive layer (560). An intermediate layer (530) is positioned adjacent to the woven fabric (550). The intermediate layer (530) is a layer with the single ended conductor (570) and non-woven fiberglass, e.g. strands (534). A bundle (540) of the strands (534) is provided and positioned in the intermediate layer (530). The strands (534) are positioned proximal to the woven fabric (550) and proximal to the conductor (570). As shown, the bundle of strands (534) is positioned in contact with the single ended conductor (570) and also positioned in contact with the woven fabric (550). The strands (534) are adjacently positioned with minimal or no openings formed there between. As shown, the strands (534) run parallel to the conductor (570) and follow the routing needed to connect a driver and a receiver for various components. Accordingly, the single ended conductor (570) is spaced apart from the dielectric material (550) via the bundle of strands (534), with the conductor (570) and the strands (534) having a matching orientation and path from a source to a destination.

Figure 6:
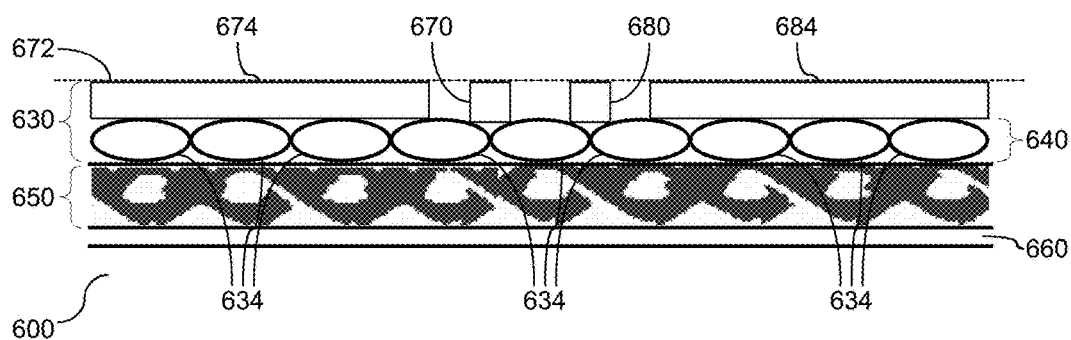
FIG. 6 depicts a diagram illustrating a cross section of the PCB laminate with a micro-strip type transmission line showing a grounded conductor pair.

Referring to FIG. 6, a diagram (600) is provided illustrating a cross section of the PCB laminate with a micro-strip type transmission line with a conductor pair and a ground conductor. As shown and described herein the conductor is in the form of a conductor pair, (670) and (680), printed on an external layer (672) of the board. Ground conductors (674) and (684) are positioned adjacent to and co-planar with the conductor pair. More specifically, ground conductor (674) is positioned adjacent to conductor (670) of the conductor pair, and ground conductor (684) is positioned adjacent to conductor (680) of the conductor pair. In one embodiment, the ground conductors (674) and (684) are comprised of copper. Fiberglass weave is shown herein as woven fabric (650) positioned adjacent to an external grounded conductive layer (660). An intermediate layer (630) is positioned adjacent to the woven fabric (650). The intermediate layer (630) is a layer with a conductor and non-woven fiberglass, e.g. strands (634). A single bundle (640) of the strands (634) is provided and positioned in the intermediate layer (630). In one embodiment, the depth of the bundle may be greater than a depth of an individual strand, and in one embodiment the depth may include two or more parallel strands. The strands (634) are positioned proximal to the woven fabric (650) and proximal to the conductor pair (670) and (680), and adjacent to the ground conductors (674) and (684). As shown, the bundle of strands (634) is positioned with one side (634a) in contact with the co-planar position of the conductor pair (670) and (680) and associated ground conductors (674) and (684), and an oppositely disposed side (634b) positioned in contact with the woven fabric (650). The strands (634) are adjacently positioned and relatively co-planar with minimal or no openings formed there between. As shown, the strands (634) run parallel to the conductor pair (670) and (680) and the ground conductors (674) and (684), and follow the routing needed to connect a driver and a receiver for various components. Accordingly, the conductor pair (670) and (680) together with the ground conductors (674) and (684) are spaced apart from the dielectric material (650) via the bundle of strands (634), with the conductor pair together (670) and (680) with the ground conductors (674) and (684), respectively, and the strands (434) having a matching orientation and path from a source to a destination.

Figure 7:
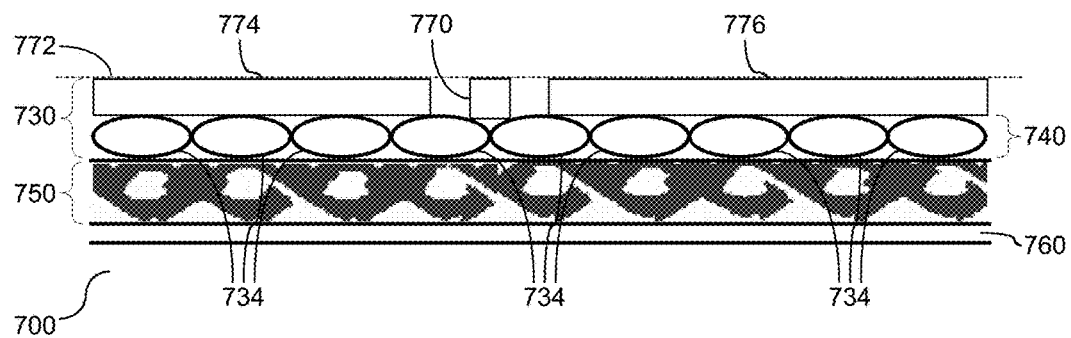
FIG. 7 depicts a diagram illustrating a cross section of the PCB laminate with a micro-strip type transmission line showing a grounded single ended conductor.

Referring to FIG. 7, a diagram (700) is provided illustrating a cross section of the PCB laminate with a micro-strip type transmission line with a single ended conductor and a ground conductor. As shown and described herein the conductor is in the form of a single ended conductor (770) printed on an external layer (772) of the board. Ground conductors (774) and (776) are positioned adjacent to and co-planar with the conductor (770). More specifically, ground conductor (774) is positioned adjacent to one side of the conductor (770) and ground conductor (776) is positioned adjacent an opposite side of the conductor (770). As shown, the conductor (770), together with the ground conductors (774) and (776) are co-planar, or relatively co-planar. In one embodiment, the ground conductors (774) and (776) are comprised of copper. Fiberglass weave is shown herein as woven fabric (750) positioned adjacent to an external grounded conductive layer (760). An intermediate layer (730) is positioned adjacent to the woven fabric (750). The intermediate layer (730) is a layer with the conductor (770) and non-woven fiberglass, e.g. strands (734). A single bundle (740) of the strands (734) is provided and positioned in the intermediate layer (730). The strands (734) are positioned proximal to the woven fabric (750) and proximal to the conductor (770) and the co-planar ground conductors (774) and (776). As shown, the bundle of strands (734) is positioned with one side (734a) in contact with the co-planar position of the conductor (770) and the associated ground conductors (774) and (784), and an oppositely disposed side (734b) positioned in contact with the woven fabric (750). The strands (734) are adjacently positioned and relatively co-planar with minimal or no openings formed there between. As shown, the strands (734) run parallel to the conductor (770) and the ground conductors (774) and (784), and follow the routing needed to connect a driver and a receiver for various components. Accordingly, the conductor (770) and the co-planar ground conductors (774) and (776) are spaced apart from the dielectric material (750) via the bundle of strands (734), with the conductor (770) and the ground conductors (774) and (776), respectively, and the strands (734) having a matching orientation and path from a source to a destination.

Figure 8:
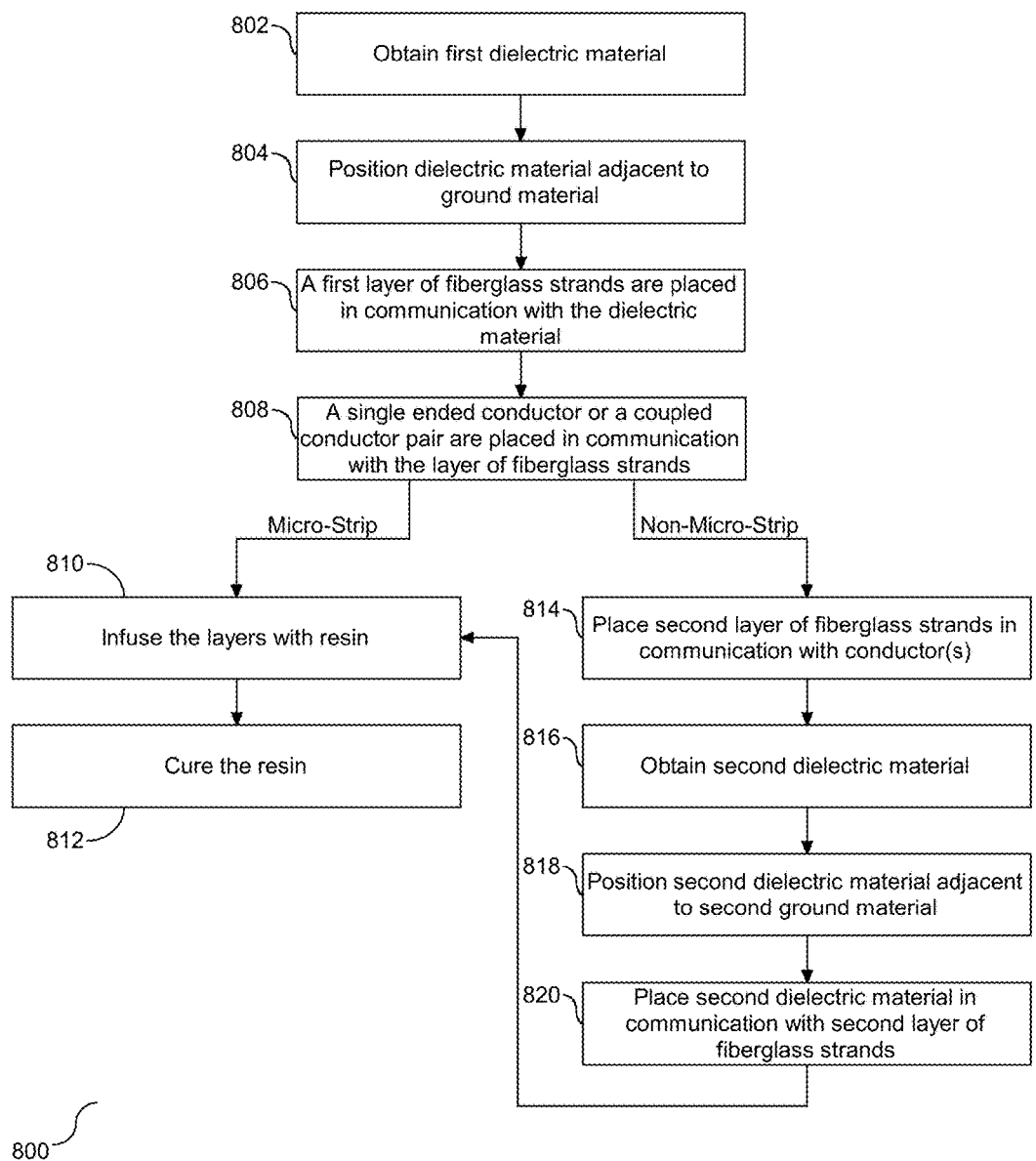
FIG. 8 depicts a flow chart illustrating a process for structuring the composite PCB with the layers shown and described in FIGS. 1-7.

Referring to FIG. 8, a flow chart (800) is provided illustrating a process for structuring the composite PCB with the layers shown and described in FIGS. 1-7. A first fiberglass weave, e.g. dielectric material, is obtained (802) and positioned adjacent to or in communication with a ground material, e.g. a copper plate, (804). The fiberglass weaves are an interweaving of a first set of fiberglass bundles in a first orientation with a second set of fiberglass bundles in a second orientation. A first layer of fiberglass strands are placed in communication with the dielectric material (806). As shown in FIGS. 1-7, the fiberglass strands are co-planar with minimal or no openings formed between adjacently positioned strands. A single ended conductor or a coupled conductor pair are placed in communication with the layer of fiberglass strands (808). As shown in FIGS. 1-7, there are various configurations of the conductor and conductor pairs, including forming a layer with a single ended conductor, a single coupled conductor pair, a combination of a single ended conductor and a coupled conductor pair, a single ended conductor with adjacently positioned ground conductors, a single coupled conductor pair with adjacent positioned ground conductors, etc. Accordingly, the placement of the conductor(s) and/or ground conductors is selective based on the desired configuration and functionality.

As shown in FIGS. 4-7, the formation of the product may be a micro-strip configuration. Following step (808) and the selection of a micro-strip configuration, the layers are infused with a resin (810) and subject to a curing process (812). Similarly, if following step (808) a PCB configuration is selected, a second layers of fiberglass strands are placed in communication with, e.g. on top of, the selected conductor(s) or coupled conductor pair(s) (814). Similar to the first layer of strands formed at step (806), the layer fiberglass strand formed at step (814) are co-planar with minimal or no openings formed between adjacently positioned strands. A second fiberglass weave, e.g. dielectric material, is obtained (816) and positioned adjacent to or in communication with a second ground material, e.g. a copper plate, (818). Similar to the first fiberglass weave, the second fiberglass weave is an interweaving of a first set of fiberglass bundles in a first orientation with a second set of fiberglass bundles in a second orientation. The second dielectric material is placed in communication with the second layer of fiberglass strands (820). Thereafter, the process returns to step (810) for infusion of the resin and curing. Accordingly, as shown herein a multi-layered PCB or micro-strip is formed with a structure directed at improving signal transmission across the PCB.

As shown and described the intermediate layer of the PCB is formed with non-woven fiberglass components positioned adjacent and parallel to the signal trace while maintaining a distance between adjacently positioned conductors. In one embodiment, the non-woven fiberglass strands are positioned relatively close to the conductor to effectively remove power resonance. When positioned with respect to the first and second fiberglass weaves, a separation distance is maintained between the first fiberglass weave and the second fiberglass weave by the intermediate layer, e.g. the non-woven bundles and the conductor(s). In one embodiment, the fiberglass weave(s) are utilized to provide strength to the formed micro-strip or PBC. The structure of the intermediate layer with the fiberglass strands, e.g. non-woven fiberglass bundles, mitigates or removes resonance caused by periodic loading inherent within the woven fiberglass weaves.

It is well known in the art that many different materials or composition of materials available for the fiberglass weave and fiberglass strands. The weave may be a single ply or multiple ply weave. The specific material or composition of the materials should not be considered limiting and may be any material used to form the PCB.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed.

It will be appreciated that, although specific embodiments have been described herein for purposes of illustration, various modifications may be made without departing from the sprit and scope of the embodiments. Accordingly, the scope of protection of the embodiments is limited only by the following claims and their equivalents.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications as are suited to the particular use contemplated. Accordingly, the structure and positioning of the intermediate layer with respect to the fiberglass weaves is directed at improving signal transmission across the PCB.

It will be appreciated that, although specific embodiments have been described herein for purposes of illustration, various modifications may be made without departing from the spirit and scope of the embodiments. In particular, the multi-layered composite PCB laminates may have additional features suitable for particular uses. Accordingly, the scope of protection of the embodiments is limited only by the following claims and their equivalents.

What is claimed is:

1. A printed circuit board, comprising:
    a first dielectric material in communication with a first ground conductive layer;
    a second dielectric material in communication with a second ground conductive layer; and
    an intermediate layer positioned between and separated from the first dielectric material and the second dielectric material, the separation to form an opening between the first dielectric material and the second dielectric material, the intermediate layer comprising:
        a conductor configured to carry a first signal trace;
        a first fiberglass material positioned between the first conductor and the first dielectric material; and
        a second fiberglass material positioned between the first conductor and the second dielectric material.

2. The printed circuit board of claim 1, further comprising the first dielectric material, the second dielectric material, and the conductor having a matching orientation and separation distance from a source to a destination.

3. The printed circuit board of claim 2, wherein the first fiberglass material is parallel to the conductor.

4. The printed circuit board of claim 2, wherein the second fiberglass material is parallel to the conductor.

5. The printed circuit board of claim 2, further comprising the conductor to follow a conducting path from the source to the destination, the first fiberglass material to follow the conducting path from the source to the destination, and the second fiberglass material to follow the conducting path from the source to the destination.

6. The printed circuit board of claim 1, further comprising a resin to bind the intermediate layer to the first and second dielectric materials.

7. The printed circuit board of claim 1, wherein the conductor is selected from the group consisting of: a single ended conductor and a differential pair.

* * * * *